United States Patent [19]

Hayase et al.

[11] Patent Number: 4,828,958
[45] Date of Patent: May 9, 1989

[54] PHOTOSENSITIVE COMPOSITION AND METHOD OF FORMING A RESIST PATTERN WITH COPOLYMER OF POLYVINYL PHENOL

[75] Inventors: Shuzi Hayase, Kawasaki; Yasunobu Onishi; Rumiko Horiguchi, both of Yokohama, all of Japan

[73] Assignee: Kabushiki Kaisha Toshiba, Kawasaki, Japan

[21] Appl. No.: 23,261

[22] Filed: Mar. 9, 1987

[30] Foreign Application Priority Data

Mar. 28, 1986 [JP] Japan ................................ 61-68803

[51] Int. Cl.$^4$ ...................... G03C 1/495; G03C 1/60; G03C 1/72; G03F 7/26
[52] U.S. Cl. .................................... 430/175; 430/169; 430/176; 430/190; 430/192; 430/193; 430/197; 430/270; 430/323; 430/325; 430/326
[58] Field of Search .............. 430/270, 176, 192, 197, 430/169, 325, 326, 190, 193, 323, 175

[56] References Cited

U.S. PATENT DOCUMENTS

| | | | |
|---|---|---|---|
| 3,869,292 | 3/1975 | Peters | 430/197 |
| 4,439,516 | 3/1984 | Cernigliaro et al. | 430/323 |
| 4,603,101 | 7/1986 | Crivello et al. | 430/270 |
| 4,678,737 | 7/1987 | Schneller et al. | 430/270 |
| 4,732,836 | 3/1988 | Potuin et al. | 430/193 |
| 4,732,837 | 3/1988 | Potuin et al. | 430/193 |
| 4,737,437 | 4/1988 | Gutsell et al. | 430/193 |

FOREIGN PATENT DOCUMENTS

| | | | |
|---|---|---|---|
| 2507548 | 4/1975 | Japan | 430/190 |
| 0017739 | 1/1985 | Japan | 430/197 |

OTHER PUBLICATIONS

English Abstract of Japanese Publication 50-95002, published 7/29/85.

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

The photosensitive composite of the present invention is obtained by including a nonsubstitutional or substitutional benzyl radical in the phenol side chain of polyvinylphenol. The photosensitive composites have not only excellent heat resistivity, RIE resistivity, and resolving power but also have a wide tolerance for the variations in the development temperature and developer concentration at the time of development. Therefore, it is possible to obtain resist patterns with fine structure.

26 Claims, No Drawings

PHOTOSENSITIVE COMPOSITION AND METHOD OF FORMING A RESIST PATTERN WITH COPOLYMER OF POLYVINYL PHENOL

BACKGROUND OF THE INVENTION

1. Field of the Invention

The present invention relates to photosensitive compositions useful for the formation of fine resist patterns, and more particularly, to photosensitive composites of positive or negative-type which show a wide tolerance for alkaline development conditions when applied to lithographic technique or the like.

2. Description of the Prior Art

Photosensitive resins are being used widely in many fields of planar processes including the manufacture of semiconductors. However, the resist patterns are becoming increasingly fine in their structure in order to increase the density of the electronic devices, accompanying diversification in functions and sophistication of these devices. In addition, resistance to heat and resistance to reactive ion etching (RIE), which is being employed widely in recent times as a method of etching resist patterns, are required. As substances that can meet these requirements, there have been proposed in the past photosensitive composites that are formed by mixing photosensitive compounds with resins that consist of homopolymers or copolymers of vinylphenol group (reference: Japanese Patent No. 56-29261).

However, there was a problem that when use is made of such prior-art photosensitive compositions, resist patterns obtained by fixing after exposure have a very narrow tolerance to the development conditions in developing, although their resolving power is admittedly high. Namely, severe restrictions are imposed on the development temperature, the developer concentration, and others, and the pattern profile deteriorates rapidly if the temperature, concentration, and so on deviate from the respective predetermined values.

Because of this, in order to obtain fine resist patterns, it is necessary to hold the changes in the developer concentration at small values by setting the developer concentration at a low level, which was a considerable inconvenience in practice.

SUMMARY OF THE INVENTION

Accordingly, the object of the present invention is to provide photosensitive compositions which have not only excellent heat resistivity, RIE resistivity, and resolving power, but also have an ample tolerance to alkaline development conditions of resist patterns, and hence, are useful to the formation of fine resist patterns.

As a result of a concentrated effort to achieve the above object, the applicants of the present invention found that by introducing an unsubstituted or substituted benzyl radical to the phenol side chain of polyvinylphenol, the alkaline solubility of resist at the time of development after exposure reduced, and hence, the tolerance to alkaline development conditions is widened. In addition, due to the presence of the phenol side chain of polyvinylphenol and the phenyl radical in the unsubstituted or substituted benzyl radical, heat resistivity and RIE resistivity can be improved, which led to the completion of the present invention.

Namely, a photosensitive composition of the present invention comprises a photosensitive compounds and a resin which contains polymers that include a structural unit as shown by the following formula:

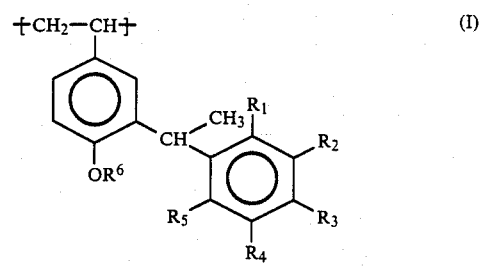

and a structural unit as shown by the following formula:

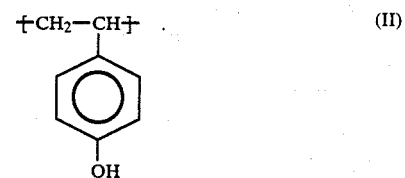

These and additional objects, features and advantages of the present invention will become apparent to those skilled in the art from the following detailed description on which, by way of example, only the preferred embodiments of this invention are illustrated.

DETAILED DESCRIPTION OF THE INVENTION

The photosensitive compositions of the present invention are used as the photoresist in photographic techniques such as printing method and the bleaching out color. The photographic technique consists ordinarily of a resist process in which, after spreading an appropriate resist material over a silicon single crystal wafer or the like, a desired resist pattern is formed by irradiating the resist material with ultraviolet rays, electron beams, or the like, and the etching process in which the wafer which is the base film is fabricated by the use of the resist pattern formed. The photosensitive compositions of the present invention are used as the resist material in this method.

Now, the resist process is a process in which a difference in the alkaline solubility is generated in the exposed portion and the unexposed portion in response to a beam irradiation, and a predetermined resist pattern is obtained by dissolving the exposed or unexposed portion with an alkaline developer. Here, the resolving power, sensitivity, and the like of the resist pattern obtained are determined eventually by the quality of the development process. Therefore, the control of the duration of development, temperature of development, concentration of the developer, and the like during the development process become extremely important. Thus the discovery of resist materials which permit the formation of patterns with high accuracy desired under lax control conditions will be very welcome.

Moreover, for the etching process, the reactive ion etching (RIE) method which enables finer fabrication is in wide use in recent years, as mentioned earlier. The resist materials of the present invention will also be used in the RIE method. Accordingly, these photosensitive compositions have to possess an excellent resistivity to RIE.

In addition, the resist material is heated to an extremely high temperature in the RIE process so that it has to be a substance which will not generate deformation at high temperatures. Otherwise, the accuracy of the resist pattern will be deteriorated quickly by such a deformation.

Moreover, the photosensitive compositions has to have in general a satisfactory adhesivity to a substrate or the like for which an eventual pattern formation is desired.

The photosensitive compositions of the present invention that satisfy these requirements consist of photosensitive compounds and resins that contain polymers that include a structural unit shown by the following formula:

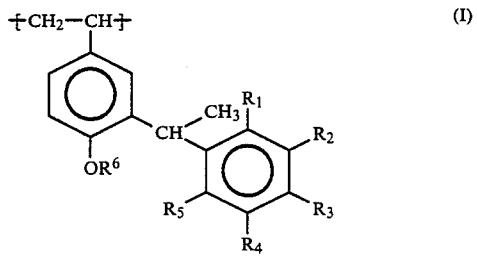

and a structural unit shown by the following formula:

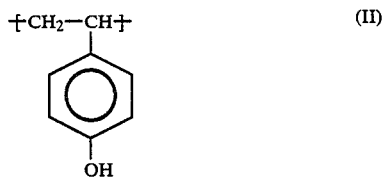

In these photosensitive compositions, an unsubstituted or substituted benzyl radical is introduced to the phenol side chain, so that their acidity is lowered, alkaline solubility of the resist, at the time of development after exposure, is reduced, and hence, tolerance to the alkaline development conditions can be increased.

It should be noted here that the number average molecular weight of the resin is desirable to be of order of $10^3$ to $10^5$.

In addition, the ideal content of a polymer that contains structural units shown by the formula (I) and (II) in the resin, is 10 to 100% by weight.

Moreover, the groups $R_1$, $R_2$, $R_3$, ..., $R_4$, and $R_5$ in the formula (I) may be identical or may be different, and each represents hydrogen atom, halogen atom, alkyl radical, carboxyl radical, alkylcarbonyl radical, alkoxycarbonyl radical, alkoxy radical, acyloxy radical, allyl radical, aryl radical, hydroxy radical, halogenoalkyl radical, cyanoalkyl radical, or alkoxyalkyl radical. In addition, $R_6$ represents hydrogen atom, alkyl radical, allyl radical, aryl radical, alkylcarbonyl radical, allylcarbonyl radical, or quinonediazidosulphonyl radical.

As mentioned earlier, a photosensitive composition of the present invention consists of a resin that contains a polymer that includes the formula (I) and (II) as the structural units, as a first indispensable constituent, and a photosensitive composites as a second indispensable constituent.

The resin which is the first indispensable constituent necessarily contains a polymer which contains in the molecule as the components a structural unit shown by the formula (I) and a structural unit shown by the formula (II). The form in which these units are contained is under no special restrictions, and can take, for example, modes as will be enumerated in the following.

(a) A copolymer that consists only of the structural unit shown by the formula (I) and the structural unit shown by the formula (II). More precisely, it is a copolymer that has a structure, for example, given by

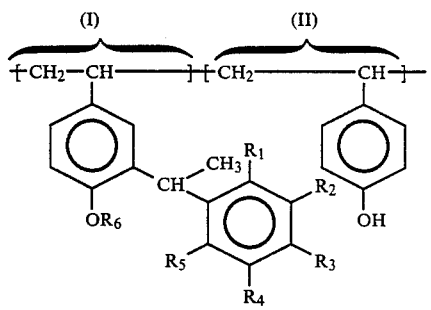

(b) A coplymer that contains, in an identical molecule, a plurality of structural units (I) in which at least one set of the substitutional groups $R_1$ to $R_5$ is different from the rest. More precisely, it is a copolymer that has, for example, the following structure (where at least one of the pairs $R_1$ and $R_{11}$; $R_2$ and $R_{12}$; ...; $R_5$ and $R_{15}$ has mutually different substitutional groups):

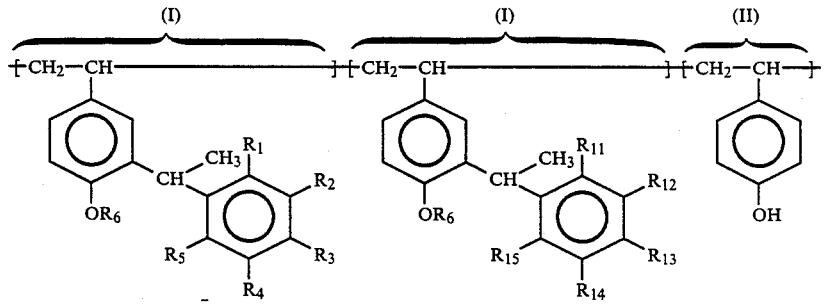

(c) A mixture of a plurality of copolymers each of which consists of the structural unit shown by the formula (I) and the structural unit shown by the formula (II) in which at least one of the set of the substitutional groups $R_1$ to $R_5$ and is different from the rest. More specifically, it is a mixture, for example, of a copolymer with the structure

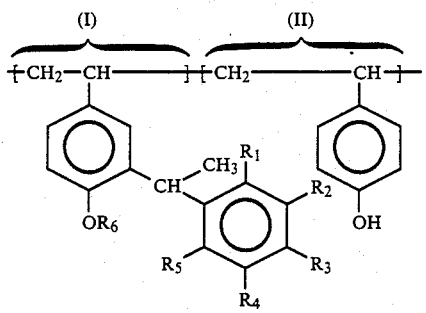

and a copolymer that has the structure

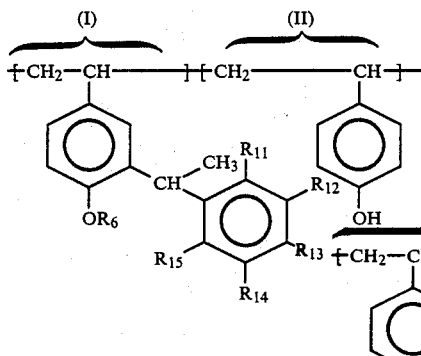

(where $R_1$ and $R_{11}$; $R_2$ and $R_{12}$; ...; $R_5$ and $R_{15}$ are pairs of substitutional groups in which at least one pair has different groups.

(d) A mixture of one kind of copolymer consisting only of the structural unit shown by formula (I) and the structural unit shown by formula (II), or a plurality of the coplymers of the above kind in which at least one set of the substitutional groups $R_1$ to $R_5$ is different from the rest, and a copolymer consisting of molecules which have one or a plurality of structural units in which at least one set of the substitutional groups $R_1$ to $R_5$ in the formulas (I) is different from the rest. More specifically, it is a mixture, for example, of a copolymer that has the structure

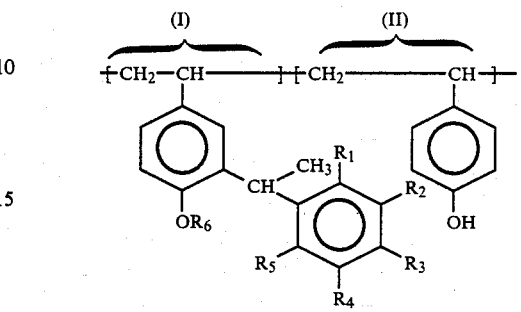

and a copolymer that has the structure

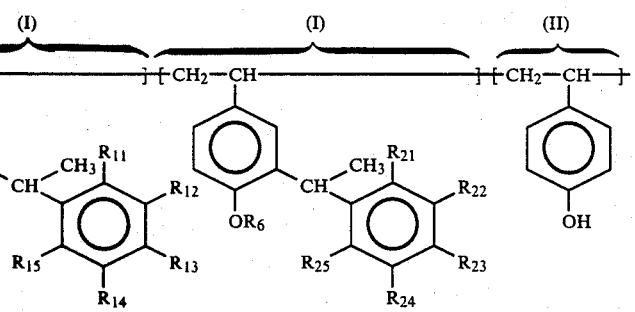

(where at least one pair of $R_{11}$ and $R_{21}$; $R_{12}$ and $R_{22}$; ...; $R_{15}$ and $R_{25}$ has mutually different substitutional groups).

(e) A mixture of a plurality of copolymers that contain in the same molecule a plurality of structural units in which at least one set of the substitutional groups $R_1$ to $R_5$ in the formulas (I) is different from the others. More specifically, it is a mixture, for example, of a copolymer that has a structure (where at least one pair of $R_1$ and $R_{11}$; ...; $R_5$ and $R_{15}$ has mutually different substitutional groups) ...; $R_5$ and $R_{15}$ has mutually different substitutional groups)

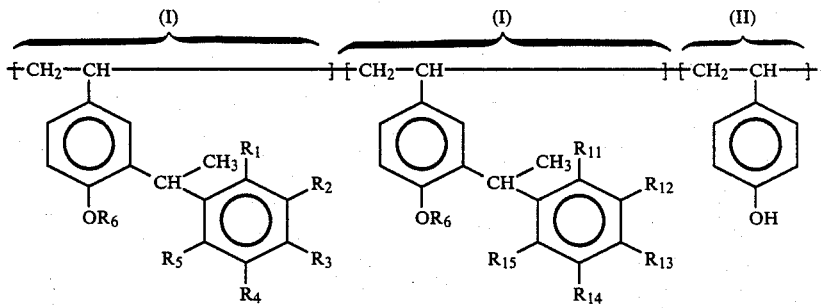

and a copolymer which has a structure (where at least one pair of $R_{21}$ and $R_{21}$; ...; $R_{25}$ and $R_{35}$ has mutually different substitutional groups)

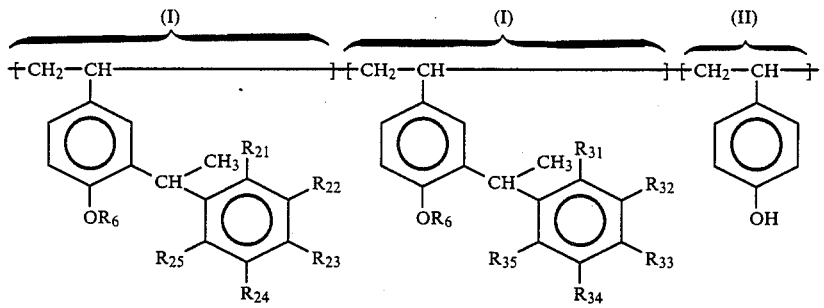

(f) A copolymer which is formed by a structural unit that consists of formula (I) and formula (II); and a structural unit that consists of at least one kind of vinyl chain or vinylidene chain such as acrylic acid, methacrylic acid, acrylic acid ester, methacrylic acid ester, or vinylalkyl ether (for instance, vinylmethyl ether), or ester chain that includes melamine, benzoguanidine, or the like.

(g) A mixture obtained by mixing a copolymer described in (a) or (b) above and a copolymer described in (f).

(h) A mixture obtained by mixing a plurality of copolymers described in (f) above.

(i) A mixture obtained by mixing a copolymer described in (a) or (b); and a homopolymer which contains as its structural unit, other than a structural unit consisting of formula (I) and at least one of styrenes such as α-methylstyrene, styrene, and 4-chlorostyrene, vinyl chain or vinylidene chain such as acrylic acid, methacrylic acid, acrylic acid ester, methacrylic acid ester, or vinylalkyl ether (for instance, vinylmethyl ether), or ester chain which includes melamine, benzoguanidine, or the like.

(j) A mixture obtained by mixing a copolymer described in (f) above; and a homopolymer which has at least one of the following constituents as the structural unit or a copolymer which has at least two kinds of the following constituents as the structural units, the constituents in question being, other than a structural unit consisting of formula (I), styrenes such as α-methylstyrene, styrene, and 4-chlorostyrene, vinyl chain or vinylidine chain such as acrylic acid, methacrylic acid, acrylic acid ester, methacrylic acid ester, or vinylalkyl ether (for instance, vinylmethyl ether), or ester chain which includes melamine, benzoguanidine, and the like.

It should be noted that whichever of the above modes is to be adopted, the rate that the copolymers, which consist of a structural unit shown by formula (I) and a structural unit shown by formula (II), occupy in the resin has to be set at 10 to 100% by weight. This is because if the rate is less than 10% by weight, there will arise such problems as poor RIE resistivity and difficult control of the alkaline solubility (in other words, if an acidic group such as acrylic acid is introduced in excess, then the resin obtained becomes excessively soluble, whereas if the amount of alkaline insoluble group such as styrene is increased, the resin obtained becomes excessively insoluble).

Further, it is necessary to set the number average molecular weight of the components of the resin that contains these polymers, in the range of $10^3$ to $10^5$. In particular, it is desirable to choose it in the range of 2,000 to 60,000 because of a more conspicuous tolerance to alkaline development, compared with the case of polyvinylphenol that was disclosed in the past. If the number average molecular weight is less than $10^3$, adhesivity of the resist becomes poor and the tolerance to alkaline development is also deteriorated. On the other hand, if it exceeds $10^5$, exposure sensitivity and the resolving power during development become poor and the tolerance to alkaline development is also deteriorated.

Further, in the case of a copolymer which consists of a structural unit shown by formula (I) and a structural unit shown by formula (II), where the number of the structural unit shown by formula (I) is k, and the number of the structural unit shown by formula (II) is l; it is desirable to set approximately $0.1 \leq k/(k+l) \leq 0.5$. If the ratio $k/(k+l)$ is less than 0.1 the resistivity to RIE is deteriorated, whereas if it exceeds 0.5 the tolerance to the alkaline development conditions becomes narrow.

The polymers in the photosensitive composition can be obtained by adding styrene to polyvinylphenol with parasulfonic acid as a catalyst.

For the photosensitive compound which represents the second indispensable component of the photosensitive composite of the present invention, use may be made of a photosensitive compound of positive or negative type. As examples of such photosensitive compound, one may mention, for instance, p-quinonediazides such as β-naphthylamide of p-benzoquinone diazidosulfonic acid, p-iminoquinonediazides as disclosed in the specifications of British Pat. Nos. 723382 and No. 942404, organic solvent soluble condensation products of diazonium salts and formaldehyde, aromatic diazonium salts such as the cocondensation products of p-diazodiphenylamine salts and 4,4-bis-methoxymethyldiphenyl ether with formaldehyde, and copolymerization products of other aromatic products and formaldehyde as disclosed in the specification of British Pat. No. 1110017 and the specification of French Pat. No. 2022413, and aromatic azides such as azido compounds as disclosed in the specification of British Pat. No. 745886. However, an organic halogen compound such as bromoform can be used if in the mixing with polyvinylphenol, use is made of low molecular weight diazonium, diazosulfonates of aromatic and complex ring type amines, quinonediazides, diazo radical, azido radicals, high molecular weight products that contain other photosensitive groups, or polyethylene oxides. Further, as the photosensitive compound, o-naphthoquinonediazidosulfonic acid and o-quinonediazides such as aromatic esters or amides of o-naphthoquinonediazidocarbonic acid are particularly useful.

In the photosensitive compositions of the present invention, the mixing ratio of resin and photosensitive compound varies depending upon the kind of resin and photosensitive compound used, and their combination.

However, generally speaking, it is desirable to use 0.1 to 50% by weight of the photosensitive compound in the photosensitive composite. This is because if the ratio is less than 0.1% by weight, sensitivity to exposure is extremely poor whereas if it exceeds 50% by weight, adhesivity of resist becomes very unsatisfactory.

Next, an example of using the photosensitive composition of the present invention as a resist material in the photographic techniques of printing or bleaching out color will be described.

As a support member (substrate) on which is to be formed a resist layer by the use of a photosensitive composition, one may choose from general materials such as plastic, metallic foil, or metallic plate.

Now, in preparing a plate for printing, for example, one needs to spread a solution in an organic solvent of a photosensitive compound of the present invention, on a support material which is rotating. As organic solvent for this purpose, it is desirable to use such ketone-based solvents as cyclohexanone, acetone, methylethylketone, methylisobutylketone, cellosolve-based solvents such as methylcellosolve, methylcellosolve acetate, and ethylcellosolve acetate, or ester-based solvents such as acetic ester, acetic butyl, and acetic isoamyl, or a mixture of some of these solvents.

A printing plate prepared in the above manner is exposed to a mercury lamp or the like, and then is developed with an aqueous solution of an alkali.

The alkaline solution used for the development may be anything that can dissolve the exposed portion in the case of positive type, and the unexposed portion in the case of negative type, and that has an extremely low dissolution speed for the remaining portion. One may mention tetraalkylammonium aqueous solutions like tetramethylammonium aqueous solutions and inorganic alkaline aqueous solution such as pottasium hydroxide, sodium hydroxide, and the like.

Then, using the pattern formed in the above process as the mask, the support material is etched. Of the two types of etching, namely, wet etching and dry etching, dry etching is preferred for forming fine patterns with line width less than 3 $\mu$m.

As a gas for dry etching, $CF_4$, $C_2F_6$, $CCl_4$, $BCl_3$, $Cl_2$, HCl, $H_2$, or the like is used, and combined if needed.

The unexposed portion that remains on the substrate after etching is removed from the top of the above material by means of a remover such as J-100 (manufactured by Nagase Chemical Industries, Inc.), oxygen gas plasma, or the like.

In this way a desired fine pattern can be formed on the support member.

As described in the foregoing, the photosensitive composite of the present invention has not only excellent heat resistivity, RIE resistivity, and resolving power, but also has a wide tolerance for alkaline development conditions, for instance, variations in concentration and temperature during development, so that it is possible to form a fine resist pattern with ease by using it.

In the following, the present invention will be described in detail by examining embodiments and a comparative example. However, the embodiments should be construed for the sake of mere explanation, and should by no means be understood to limit the present invention.

EXAMPLES

Example 1

Styrene and polyvinylphenol (number average molecular weight: 7,000) were reacted in a molar ratio of 2:10 to obtain a copolymer as shown by the following formula:

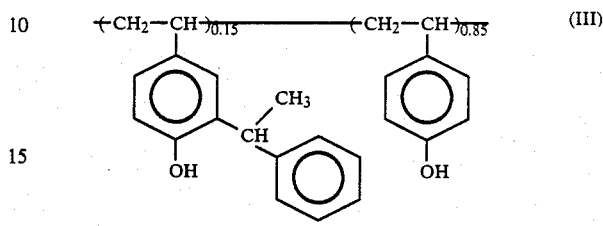

Then, a resin was prepared by introducing benzoyl radical in place of hydrogen atom of the hydroxyl radical in phenol, by supplying benzoyl in a molar ratio of 1:10 for the copolymer.

After that, 20 parts by weight of a photosensitive compound shown by the following formula:

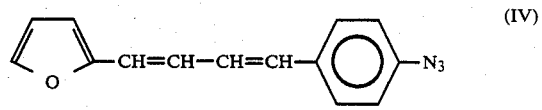

is mixed for 80 parts by weight of the resin to obtain a photosensitive composition.

A silicon wafer was heated on a hot plate at 150° C. for one hour, after which the wafer was cooled to the room temperature, and was left in an atmosphere of hexamethyldisilazane (HMDS) for 3 minutes before it was taken out. Then, a cyclohexanone solution of the photosensitive composite was spread over the silicon wafer with a spinner, dried on a hot plate at 90° C. for 5 minutes, forming a photoresist layer having a thickness of 1.5 $\mu$m. Following that, the photoresist was exposed in a stepper that uses monochromatic radiation of 436 nm and developed for 20 seconds in a 3.0% aqueous solution of tetramethylammoniumhydroxide (TMAH) at 21° C., to form a resist pattern. Here, with the initial film thickness of 1.5 $\mu$m maintained, lines and spaces (L/S) of 1.0 $\mu$m each were resolved. Observation with scanning electron microscope confirmed that there was obtained a resist pattern whose cross section has a steep profile.

When a photoresist which was irradiated by a stepper in a manner similar to the above, was developed for 20 seconds in a 3.2% aqueous solution of TMAH at 21° C., there was obtained a resist pattern which has a profile approximately similar to the above. As a result of repeated experiments of similar kinds, it was found that resist patterns with steep cross sectional profile could be obtained for variations in the range of 25° C.±5° C. for the developer temperature and for variations in the range of 3.0%±0.2% for the developer concentration. Resist patterns that are obtained in this manner have sufficient resistivity to heat, with absolutely no flow even when baked at 140° C., in the case of L/S of 10 $\mu$m.

In addition, the resistivity to RIE was found to be improved by about 30% compared with the prior-art resist patterns. Here, the resistivity to RIE is determined by measuring the film thickness before and after RIE.

Example 2

An experiment was carried out similarly to Example 1, except for the use of 1,2-naphthoxydiazido-5-sulfonic acid ester (average esterification factor of 2.0) of 2,3,4-trihydroxybenzophenone as the photosensitive compound. A resist pattern was obtained by developing for 60 seconds at 21° C. using a 2.2% aqueous solution of TMAH as the developer. Analogous to Example 1, there was obtained a resist pattern with a steep cross sectional profile even if the developer temperature was varied in the range of 25° C.±5° C. and the concentration is varied in the range of 2.2%±0.2%. In addition, heat resistivity and RIE resistivity obtained were similar to the results in Example 1.

Example 3

Esterification was carried out for the copolymer shown by the formula (III) as used in Example 1 by causing it to react with 1,2-naphthoquinonediazido-5-sulfonic acid chloride of molar ratio of 0.3, to obtain a resin by the introduction of

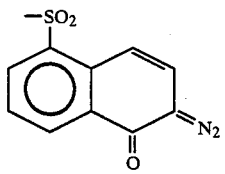

in place of the hydrogen atom in the hydroxyl radical of phenol. As a result of carrying out an experiment similar to Example 1 without utilizing a photosensitive compound, due to the fact that the resin possesses photosensitivity of its own, it was confirmed that the resin has excellent properties analogous to that of Example 1.

Example 4

By reacting styrene polyvinylphenol (number average molecular weight:9,000) in a molar ratio of 3:10 the copolymer which is shown by the following formula was obtained:

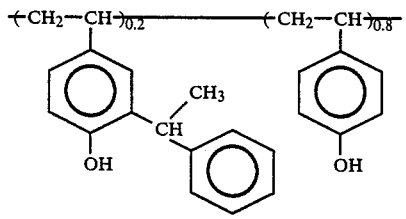 (V)

Then, a methyl radical was added to the copolymer in the molar ratio of 3:10 to introduce a methyl radical in place of the hydrogen atom in the hydroxyl radical of phenol, and a resin was obtained.

Using the resin, a photosensitive composition was obtained in a manner similar to Example 1. Experiments similar to Example 1 confirmed that the composite has excellent properties similar to the composite of Example 1.

Example 5

A resin consisting of a copolymer shown by the following formula:

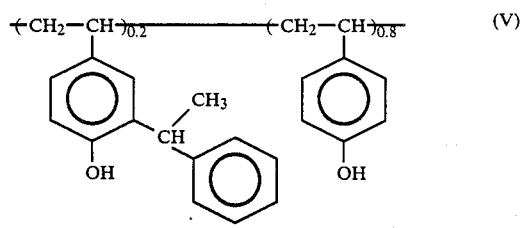 (V)

was obtained by reacting styrene and polyvinylphenol (number average molecular weight:6,000) in the molar ratio of 2:10. A photosensitive composite was obtained by mixing 30 parts by weight of the photosensitive compound shown by the following formula:

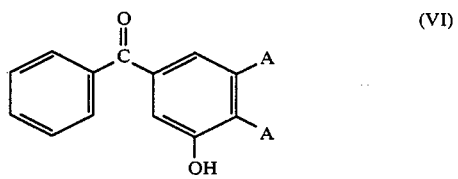 (VI)

for 100 parts by weight of the resin produced, where A in the above formula represents

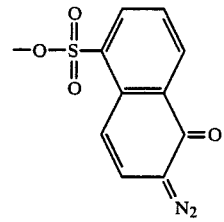

On the other hand, a silicon wafer was heated on a hot plate at 150° C. for one hour, and after cooling it to the room temperature, it was left standing for 3 minutes in an atmosphere of hexamethyldisilazane (HMDS) before it was taken out.

Next, a solution of the photosensitive composition was spread over the silicon wafer with a spinner, dried on a hot plate for 2 minutes at 90° C., and a photoresist of thickness 1.5 μm was formed. Then, a resist pattern was formed by exposing the photoresist to monochromatic radiation of 436 nm by means of a stepper, and by developing for 45 seconds with a 2.38% aqueous solution of tetramethylammonium hydroxide (TMAH) at 25° C. As a result, lines and spaces of 0.7 μm were resolved while maintaining the initial film thickness of 1.5 μm. In addition, it was confirmed by an observation of scanning electron microscope that there was formed a resist pattern whose cross section showed a steep profile.

Further, when a photoresist which was similarly exposed by the use of a stepper, was developed for 30 seconds with a 2.5% aqueous solution of TMAH at 25° C., there was obtained a resist pattern that possessed approximately the same profile as above. As a result of repetition of these experiments, it was found that resist patterns with steep sectional profile could be obtained even if the developer temperature was varied in the range of 25° C.±5° C. and the concentration was varied in the range of 2.3%±0.2%. Further, it was confirmed that resist patterns obtained in this manner have sufficient resistivity to heat with absolutely no flow even after baking for 5 minutes at 140° C. in the case of lines and spaces of 10 μm. Moreover, the resistivity to RIE was found to be improved by about 50% compared with the existing resist patterns.

Comparative Example

A solution of photosensitive compositions was prepared by mixing, in 80 g of cyclohexanone 20 g of polyvinylphenol of number average molecular weight 10,000 and 4 g of a photosensitive compound, 4-azido-4'-methoxy-α-cyanostilbene.

Following that, tests similar to those of Example 1 showed that development has to be performed for 30 seconds with a 0.76% aqueous solution of TMAH at 25° C. Moreover, it was found that development could not proceed unless under strict conditions compared with the case of the present invention with respect to the temperature control as well as to the adjustment of the concentration of TMAH.

What is claimed is:

1. A photosensitive composition comprising an admixture of:
   (a) a resin which comprises a polymer that comprises
   (i) a structural unit as shown by the following formula:

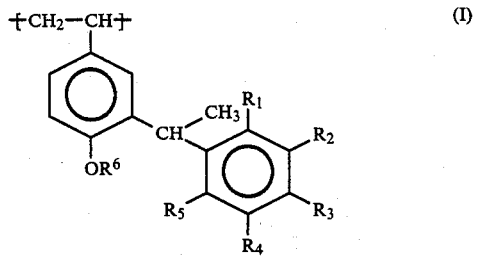

wherein $R_1$, $R_2$, $R_3$, $R_4$, and $R_5$ may be identical or may be different, each representing hydrogen atom, halogen atom, alkyl radical, carboxyl radical, alkylcarbonyl radical, alkoxycarbonyl radical, alkoxy radical, acyloxy radical, allyl radical, aryl radical, hydroxy radical, halogenoalkyl radical, cyanoalkyl radical, or alkoxyalkyl radical, and $R_6$ represents hydrogen atom, alkyl radical, allyl radical, aryl radical, alkylcarbonyl radical, allylcarbonyl or radical, and
   (ii) a structural unit as shown by the following formula:

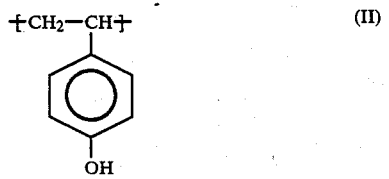

and
   (b) a photosensitive compound of positive or negative type.

2. The photosensitive composition of claim 1 wherein said resin comprises a copolymer which consist of the structural unit shown by the formula (I) and the structural unit shown by the formula (II).

3. The photosensitive composition of claim 1 wherein said resin comprises a copolymer consists of
   (a) a plurality of structural units shown by the formula (I) in which at least one set of the substitutional groups $R_1$ to $R_5$ is different from the rest, and
   (b) a structural unit shown by the formula (II).

4. The photosensitive composition of claim 1 wherein said resin comprises a mixture of plural kinds of mutually different copolymers as described in claim 2, in which at least one set of the substitutional groups $R_1$ to $R_5$ included in the copolymers differs from the rest.

5. The photosensitive composition of claim 1 wherein said resin comprises a mixture of a copolymer as described in claim 2, and a copolymer which consists of a structural unit shown by the formular (I), a structural unit shown by the formular (II) and a structural unit selected from the group consisting of vinyl chain, vinylidene chanin and ester chain.

6. The photosensitive composition of claim 1 wherein said resin comprises a mixture of plural kinds of mutually different copolymers each of which consist of a structural unit shown by the formular (I), structural unit shown by the formula (II), and a structural unit selected from the group consisting of vinyl chain, vinylidene chain and ester chain.

7. The photosensitive composition of claim 1 wherein the number average molecular weight of said resin is $10^3$ to $10^5$.

8. The photosensitive composition of claim 7 wherein the number average molecular weight of said resin is 2,000 to 60,000.

9. The photosensitive composition of claim 7 wherein the content in said resin of a polymer which comprises structural units shown by the formula (I) and the formula (II), is 10 to 100% by weight.

10. The photosensitive composition of claim 9 wherein the content of said photosensitive compound in the photosensitive composite is 0.1 to 50% by weight.

11. The photosensitive composition of claim 9 wherein the number of structural unit shown by the formula (I) is k, and the number of structural unit shown by the formula (II) is l, and k and l satisfy the condition $0.1 \leq k/(k+l) \leq 0.5$.

12. The photosensitive composition of claim 9 wherein said photosensitive compound is
   (a) a condensation product, which is soluble in organic solvent, between a p-quinonediazide, p-iminoquinonediazide, or diazonium salt and formaldehyde,
   (b) a copolymerization product between an aromatic diazonium salt or an aromatic product and formaldehyde,
   (c) an aromatic azide, or
   (d) an organic halogen compound.

13. The photosensitive composition of claim 9 wherein said photosensitive compound is
   (a) an aromatic ester of o-naphthoquinonediazidosulfonic acid or o-naphthoquinonediazidocarbonic acid, or
   (b) o-quinonediazide such as amide.

14. The photosensitive composition of claim 9 wherein said photosensitive compound comprises a compound shown by

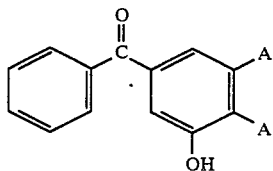
(VI)

where A in the above formula is represented by

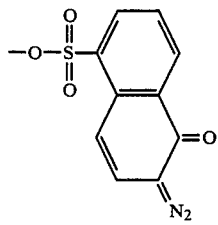

15. The photosensitive of claim 14 wherein said resin comprises a copolymer shown by the following formula

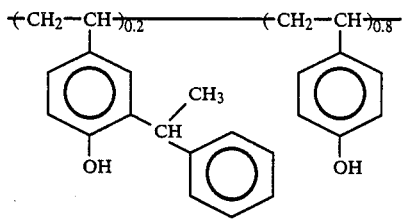
(V)

and the mixing ratio of the resin and the photosensitive compound is 30 parts by weight of the photosensitive compound for 100 parts by weight of the resin.

16. A method of producing the photosensitive of claim 9 comprising the steps of:

(a) obtaining a copolymer shown by the formula

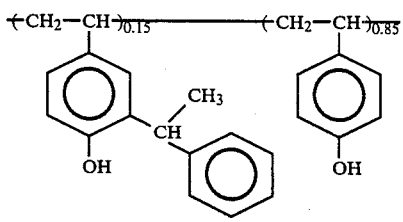
(III)

by reacting styrene and polyvinylphenol in the molar ratio of 2:10;

(b) preparing a resin by introducing benzyl radical to the copolymer in the molar ratio of 1:10 to introduce the benzoyl radical in place of the hydrogen atom in the hydroxyl radical of phenol; and (c) mixing 20 parts by weight of a photosensitive compound shown by

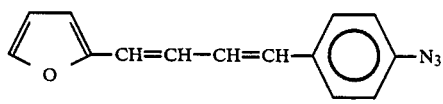

and 80 parts by weight of the resin obtained.

17. A method of producing the photosensitive composition of claim 9 comprising the steps of:

(a) obtaining a copolymer shown by the formula

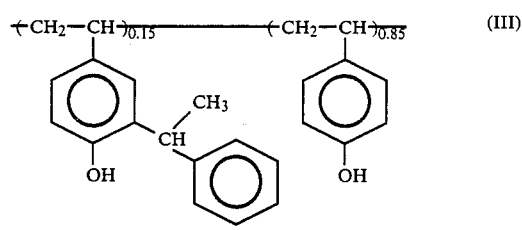
(III)

by reacting styrene and polyvinylphenol in the molar ratio of 2:10;

(b) preparing a resin by supplying benzoyl radical to the copolymer in the molar ratio of 1:10 to introduce the benzoyl radical in place of hydrogen atom in the hydroxyl radical of phenol; and (c) mixing the resin with 1,2-naphthoxydiazido-5-sulfonic acid ester (average esterification factor of 2.0) of 2,3,4-trihydroxybenzophenone as a photosensitive compound.

18. A method of producing the photosensitive composition of claim 9 comprising the steps of:

(a) obtaining a copolymer shown by the formula

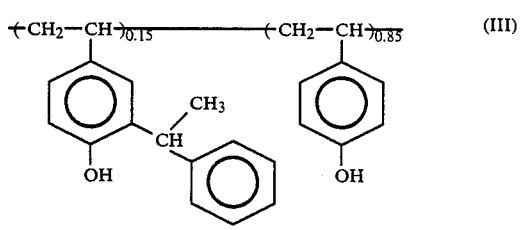
(III)

by reacting styrene and polyvinylphenol in the molar ratio of 2:10; and (b) introducing

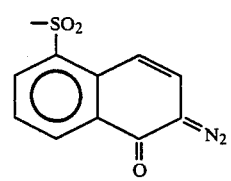

in place of the hydrogen atom in the hydroxyl radical of phenol, by carrying out esterification in which 1,2-naphthoquinonediazido-5-sulfonic acid chloride and the copolymer are brought into reaction in the molar ratio of 3:10.

19. A method of producing the photosensitive composition of claim 9 comprising the steps of:

(a) obtaining a copolymer shown by the formula

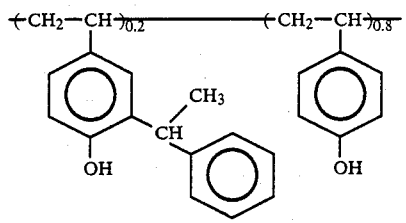 (V)

by reacting styrene and polyvinylphenol in the molar ratio of 3:10;

(b) introducing the methyl radical in place of the hydrogen atom in the hydroxyl radical of phenol by supplying methyl radical to the copolymer in the molar ratio of 3:10; and (c) mixing 20 parts by weight of a photosensitive compound shown by

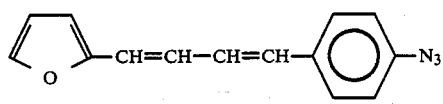

to 80 parts by weight of the resin.

20. A method of forming a resist pattern on the surface of a substrate by the use of a photosensitive composition that consists of a photosensitive compound and a resin which comprises polymers that comprises (i) a structural unit as shown by the following formula,

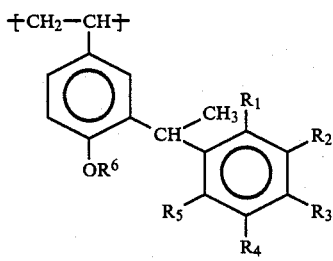 (I)

wherein, $R_1$, $R_2$, $R_3$, and $R_5$ may be identical or may be different, each representing a hydrogen atom, halogen atom, alkyl radical, carboxyl radical, alkylcarbonyl radical, alkoxycarbonyl radical, alkoxy radical, acyloxy radical, allyl radical, aryl radical, hydroxy radical, halogenoalkyl radical, cyanoalkyl radical, or alkoxyalkyl radical, and $R_6$ represents a hydrogen atom, alkyl radical, allyl radical, aryl radical, alkylcarbonyl radical, allylcarbonyl radical, or quinonediazidosulfonyl radical, and (ii) a structural unit as shown by the following formula:

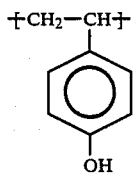 (II)

comprising the steps of:

(a) dissolving the photosensitive composition in an organic solvent;

(b) spreading the photosensitive composition on the surface of the substrate;

(c) creating a difference in the solubility to an alkaline aqueous solution between the exposed portion and the unexposed portion by irradiating the surface of the substrate with either one of light or electron beam to form a predetermined pattern; and (d) dissolving either one of the exposed portion or unexposed portion by developing the surface of the substrate with an alkali.

21. The method of forming a resist pattern of claim 20 wherein said photosensitive compound is of positive type so that the exposed portion is dissolved in said alkaline developer.

22. The method of forming a resist pattern of claim 20 wherein said photosensitive compound is of negative type so that the unexposed portion is dissolved in said alkaline development.

23. The method of forming a resist pattern of claim 20 wherein said organic solvent is (i) a ketone-based solvent such as cyclohexanone, acetone, methylethylketone, and methylisobutylketone, (ii) a cellosolve-based solvent such as methylcellosolve, methylcellosolve acetate, and ethylcellosolve acetate, or (iii) an ester-based solvent such as acetic acid ethyl, acetic acid butyl, and acetic acid isoamyl, (iv) or a mixture of these solvents.

24. The method of forming a resist pattern of claim 20 wherein said alkaline solution for the alkaline development comprises an aqueous solution of tetraalkylammonium or an aqueous solution of an inorganic alkali.

25. A method of fabricating a substrate by the use of a resist pattern formed on the surface of the substrate according to the method described in claim 20 comprising the steps of:

(a) etching the substrate using said resist pattern as the mask; and (b) removing the resist material that remains on the substrate.

26. A photosensitive composition comprising a polymer that comprises (i) a structural unit as shown by the following formula:

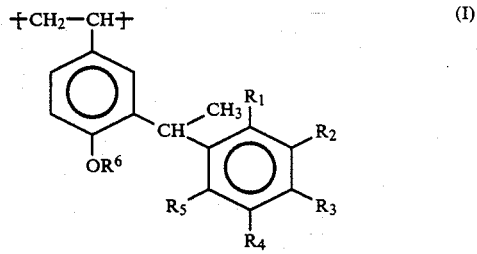 (I)

wherein $R_1$, $R_2$, $R_3$, $R_4$, and $R_5$ may be identical or may be different, each representing hydrogen atom, halogen atom, alkyl radical, carboxyl radical, alkylcarbonyl radical, alkoxycarbonyl radical, alkoxy radical, acyloxy radical, allyl radical, aryl radical, hydroxy radical, halogenoalkyl radical, cyanoalkyl radical, or alkoxyalkyl radical, and $R_6$ represents quinonediazide sulfonyl radical, and (ii) a structural unit as shown by the following formula:
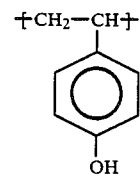
* * * * *